(12) United States Patent
Rowlandson et al.

(10) Patent No.: US 6,636,442 B2
(45) Date of Patent: Oct. 21, 2003

(54) NON-VOLATILE MEMORY ELEMENT HAVING A CASCODED TRANSISTOR SCHEME TO REDUCE OXIDE FIELD STRESS

(75) Inventors: Michael Rowlandson, Portland, OR (US); Andrew Horch, Sunnyvale, CA (US)

(73) Assignee: Lattice Semiconductor Corporation, Hillsboro, CA (US)

( * ) Notice: Subject to any disclaimer, the term of this patent is extended or adjusted under 35 U.S.C. 154(b) by 0 days.

(21) Appl. No.: 10/059,624

(22) Filed: Jan. 29, 2002

(65) Prior Publication Data

US 2003/0142549 A1 Jul. 31, 2003

(51) Int. Cl.$^7$ ................................................ G11C 16/04
(52) U.S. Cl. ............................ 365/185.28; 365/185.05; 365/185.02
(58) Field of Search ....................... 365/185.28, 185.05, 365/185.02

(56) References Cited

U.S. PATENT DOCUMENTS 5,706,240 A  *  1/1998  Fiocchi et al. ............... 327/540
5,914,514 A      6/1999  Dejenfelt ..................... 257/322

* cited by examiner

Primary Examiner—Huan Hoang
(74) Attorney, Agent, or Firm—Fliesler, Dubb, Meyer & Lovejoy, LLP

(57) ABSTRACT

A non-volatile memory cell (FIG. 3) is provided which includes three transistors, a floating gate non-volatile storage transistor (303) and two cascode connected select transistors (301–302). The two cascoded select transistors (301–302) act together to block the programming voltage when the memory cell is included in an array, and the memory cell is not selected for programming. A value of an unselect voltage applied to the gate of the first cascode connected transistor (301) is set to prevent breakdown of the oxide in the first cascode transistor (301) as well as the second cascode transistor (302). A value of an unselect voltage applied to the gate of the second cascode connected transistor (302) can be selected so that the voltage passed to the floating gate storage transistor (303) will not result in a program drain disturb, or source disturb condition.

12 Claims, 2 Drawing Sheets

NON-VOLATILE MEMORY ELEMENT HAVING A CASCODED TRANSISTOR SCHEME TO REDUCE OXIDE FIELD STRESS

BACKGROUND OF THE INVENTION

1. Field of the Invention

The present invention relates generally to non-volatile memory cells with both a select transistor and a floating gate storage transistor used with high density programmable logic devices (PLDs). More particularly, the present invention relates to a method for reducing field oxide stress and program disturb conditions in the memory cell.

2. Background

FIG. 1 shows a conventional two transistor non-volatile memory cell used with a PLD. The memory cell includes a nonvolatile floating gate storage transistor 100, along with a conventional select memory transistor 102. The select transistor 102 is used to prevent programming of the floating gate storage transistor 100 when the two transistor cell is in an array of memory cells and other cells on the same bitline are being programmed.

FIG. 2 shows a cross-section of the layout for the conventional two transistor memory cell of FIG. 1. As shown, the floating gate storage transistor 100 is an NMOS device including an n+ type source region 200 and an n+ type drain region 202 provided in a p type substrate. The floating gate is a polysilicon region 204 with a portion 206 which creates a tunneling region in the oxide material 207 between the polysilicon gate 204 and the p type substrate. The floating gate 204 is provided over the channel in the substrate between the source 200 and drain 202. A control gate 210 is provided above the polysilicon gate 206, and is formed from a conductive material to which gate control signals are applied.

The select transistor 102 has a source 202 formed in common with the drain of the storage transistor 100. An n+ type drain region 212 of the select transistor 102 is formed in the p substrate with a conductive gate region 214 overlying the channel between the source 202 and drain 212. An oxide material 215 is provided between the gate 214 and channel of transistor 102.

The select transistor 102 is used to prevent a program disturb condition. The program disturb condition can be a drain disturb event which occurs in a floating gate transistor in an unselected memory cell connected to the same bit line as a selected memory cell transistor. The high bit line program voltage and low unselect gate voltage applied to a floating gate storage transistor to prevent programming when a select transistor is not used causes a high electric field to be applied between the gate and drain of the floating gate transistor. The high electric field may cause electrons to tunnel between the floating gate and drain resulting in a drain disturb programming condition where the unselected cell is unintentionally programmed. Similarly, since the source electrode of the selected and unselected memory cells may be connected together on a bit line, a source disturb event can likewise cause an unintentional programming of unselected memory cells. A select transistor effectively blocks the bitline drain voltage from the storage transistor to prevent drain disturb or source disturb conditions.

With a high bit line programming voltage (Vpp) now applied to the drain of a select transistor 102, avalanche breakdown can occur in the select transistor causing damage. With the high programming voltage applied to the bit line, and zero volts applied to the gate of the select transistor 102, avalanche breakdown can occur through the oxide region 215 between the drain 212 and gate 214 resulting in damage to the oxide region 215.

Instead of zero volts, an intermediate voltage (Vunselect) can be applied to the gate of select transistors in memory cells which are not to be programmed. The value of Vunselect is bounded by a "voltage box" on the high side by a soft programming condition, where insufficient voltage should be passed through to the programming element to allow any programming due to a disturb condition. The value of Vunselect is bounded on the low side by the oxide breakdown concerns where the voltage from the drain of the select device to the gate of the select device exceeds the intrinsic breakdown voltage of the insulating oxide film.

SUMMARY

In accordance with the present invention, a voltage box on select transistors of conventional memory cells is avoided.

In accordance with the present invention, a memory cell is provided including three transistors, a floating gate non-volatile storage transistor and two cascode connected select transistors. The two cascoded select transistors act together to block the bit line programming voltage when the memory cell is connected in an array, and the cell is not selected for programming. A value of an unselect voltage (Vunselect1) applied to the gate of the first cascode connected transistor connected directly to the bit line can be set to eliminate the select transistor oxide breakdown concern. A value of an unselect voltage (Vunselect2) applied to the gate of the second transistor can be selected so that the voltage passed to the floating gate storage transistor will not result in a program disturb condition.

BRIEF DESCRIPTION OF THE DRAWINGS

The present invention will be described with respect to particular embodiments thereof, and references will be made to the drawings in which.

DETAILED DESCRIPTION

Figure 3:
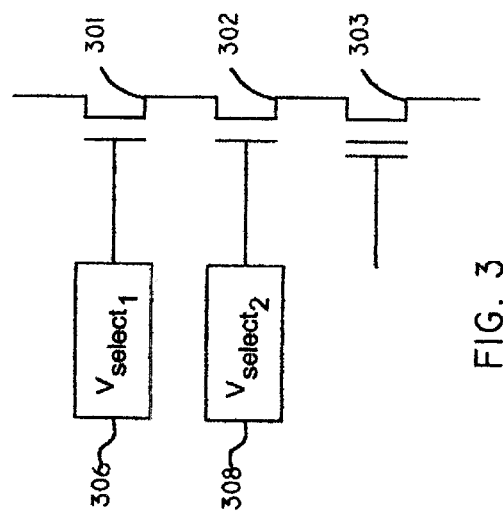
FIG. 3 shows a memory cell in accordance with the present invention.

FIG. 3 shows a memory cell in accordance with the present invention. The memory cell includes two cascode connected select transistors 301 and 302 and a floating gate storage transistor 303. The transistors 301–303 have source-drain paths connected in series, and select/unselect voltages applied from a first voltage reference labeled Vselect1 306 and a second voltage reference labeled Vselect2 308 to the respective gates of transistors 301 and 302.

Transistors 301 and 302 are connected in a cascode configuration indicating that the transistors are turned on and off by varying voltage applied to the drain with the gate voltage fixed, rather than varying the gate voltage. In a cascode transistor with $(v_g - v_d) > v_t$, wherein $v_g$ is the gate voltage, $v_d$ is the drain voltage, and $v_t$ is the threshold voltage of the transistor, the cascode transistor will turn on. With $(v_g - v_d) < v_t$ the cascode transistor will turn off.

Figure 2:
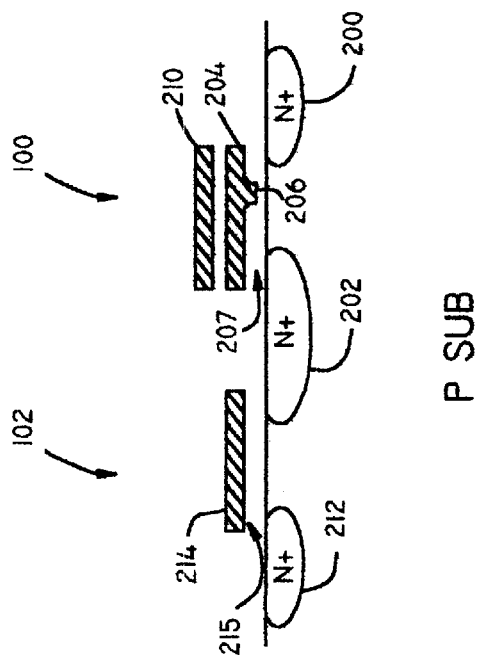
FIG. 2 shows a cross section of a layout for the memory cell of FIG. 1.
Figure 1:
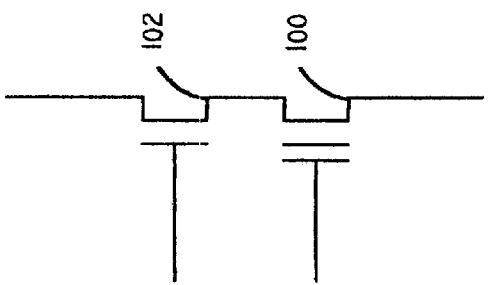
FIG. 1 shows a conventional two transistor memory cell.

Each of the transistors 301–303 are NMOS devices. A layout of transistors 302 and 303 is similar to the layout of conventional transistors 100 and 102 shown in FIG. 2. The layout of transistor 301 will be similar to the layout for transistor 302, with transistor 301 having a source in common with the drain of transistor 302.

The two cascoded select transistors 301–302 act together to block the programming voltage when programming of the cell is not desired, and to avoid the "voltage box" effect described previously. To avoid the voltage box effect, the value of Vunselect1 applied from the voltage reference 306 to the gate of transistor 301 when the memory cell is not selected for programming is set exclusively by the oxide breakdown concern. The value Vunselect1 will be set to cause a drain to gate voltage drop in transistor 301, so that the voltage on the source of transistor 302 is significantly lower than if one select transistor were used, but high enough to avoid avalanche breakdown and possible oxide damage in transistor 301. The voltage passed to the drain of transistor 302 will be some fraction of Vpp applied to the bitline during programming as controlled by Vunselect1.

The scheme of using two select cascode transistors to avoiding oxide damage can be extended to any number of select cascode transistors connected in a series configuration. The values of the unselect voltages applied to the gates of the multiple transistors will be chosen to cause a slight voltage drop across each select transistor without damaging the transistor, so that the bit line programming voltage will not damage any one transistor in the series. If the cell is selected for programming, a value of Vpp or higher can be applied to the gate of each of the select transistors to assure the programming voltage Vpp is applied to the gate of the floating gate storage transistor 303.

The voltage Vunselect2 applied from the voltage reference 308 to the gate of transistor 302 is selected so that the voltage passed, to the floating gate storage transistor 303 will not result in a program disturb condition. A program disturb condition can occur at a voltage less than ½ of Vpp. The select voltage Vunselect2 will cause a drain to gate voltage drop through transistor 302, so that a voltage less than the drain disturb voltage is applied to the drain of transistor 303.

Figure 4:
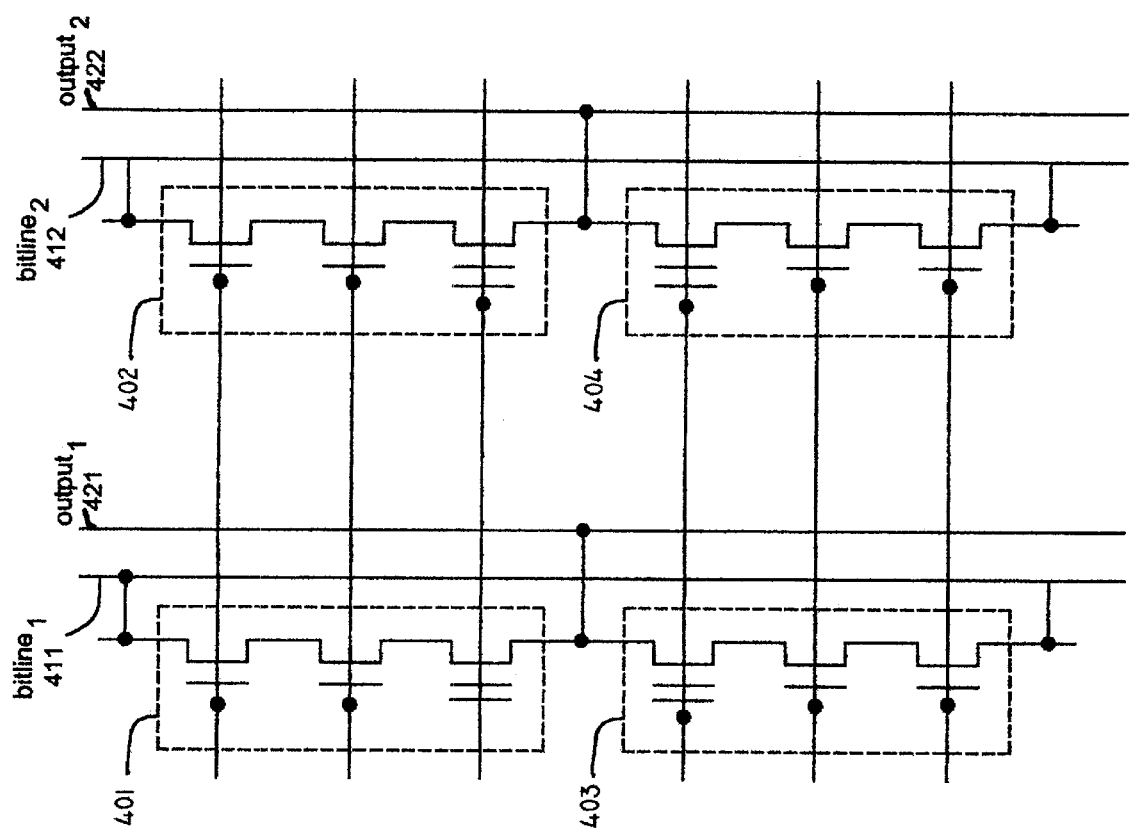
FIG. 4 shows a group of memory cells as shown in FIG. 3 connected in an array configuration.

FIG. 4 shows four memory cells 401–404, as shown in FIG. 3 connected in an array configuration. The memory cells 401 and 403 are connected so that the source of the floating gate storage transistor from each memory cell is connected to a common output line 421. Since the output from both cells 401 and 403 are connected to the common output line, only one cell can be selected at a time. Alternatively, the cells 401 and 403 can be connected to separate outputs at the source of their floating gate storage transistors.

The memory cells 401 and 403 are further connected to a common bitline 411 at the drain of their first cascode select transistor. Memory cells 402 and 404 are similarly connected to a common output 422, and a common bitline 412, separate from the memory cells 401 and 403. The memory cells 401 and 402 share common gate or wordline select voltage inputs. Similarly, memory cells 403 and 404 share common wordline select voltage inputs.

Although the present invention has been described above with particularity, this was merely to teach one of ordinary skill in the art how to make and use the invention. Many other modifications will fall within the scope of the invention, as that scope is defined by the claims provided below.

What is claimed is:

1. A method for preventing programming of a given non-volatile memory cell in an array of memory cells, the given memory cell including a floating gate transistor having a source-drain path connected to the source-drain path of a second of two select transistors which have source-drain paths connected in series, wherein a programming voltage is applied to a bitline connected to the source-drain path of a first of the two select transistors, the method comprising the steps of:

applying a first select voltage to the gate of the first select transistor, the first select voltage having a value set to prevent damage to an oxide material between the gate and drain of the first select transistor; and applying a second select voltage to the gate of the second select transistor, the second select voltage having a value set to prevent the charge stored by the floating gate transistor from being disturbed.

2. A memory cell comprising:

a first select transistor having a source-drain path and a gate;

a second select transistor having a source-drain path connected in series with the source-drain path of the first select transistor, and having a gate;

a floating gate storage transistor having a source-drain path connected in series with the source-drain path of the second select transistor;

a means for applying a voltage to the gate of the first select transistor so that when a bitline programming voltage is applied to the source-drain path of the first select transistor to enable programming of the floating gate storage transistor, and when programming of the floating gate storage transistor is not desired, damage will not occur to an oxide material between the gate and drain of the first select transistor; and a means for applying a voltage to the gate of the second select transistor so that when the bitline programming voltage is applied to the source-drain path of the first select transistor, and programming of the floating gate storage transistor is not desired, charge stored by the floating gate storage transistor will not be disturbed.

3. A memory cell comprising:

a first select transistor having a source-drain path and a gate;

a second select transistor having a source-drain path connected in series with the source-drain path of the first select transistor, and having a gate;

a floating gate storage transistor having a source-drain path connected in series with the source-drain path of the second select transistor;

a first voltage reference configured for providing a voltage to the gate of the first select transistor so that when a bitline programming voltage is applied to the source-drain path of the first select transistor to enable programming of the floating gate storage transistor, and when programming of the floating gate storage transistor is not desired, damage will not occur to an oxide material between the gate and drain of the first select transistor; and a second voltage reference configured for providing a voltage to the gate of the second select transistor so that when the bitline programming voltage is applied to the source-drain path of the first select transistor, and programming of the floating gate storage transistor is not desired, charge stored by the floating gate storage transistor will not be disturbed.

4. The memory cell of claim 3, wherein the first select transistor, the second select transistor and the floating gate storage transistor comprise NMOS devices.

5. The memory cell of claim 3, wherein the first select transistor and the second select transistor comprise volatile devices.

6. An array of memory cell transistors comprising: memory cells comprising:
- a first select transistor having a source-drain path and a gate;
- a second select transistor having a source-drain path connected in series with the source-drain path of the first select transistor, and having a gate; and
- a floating gate storage transistor having a source-drain path connected in series with the source-drain path of the second select transistor;
- a first array output connected to the source-drain path of the floating gate storage transistor in a first portion of the memory cells; and
- a second array output connected to the source-drain path of the floating gate storage transistor in a second portion of the memory cells.

7. The array of claim 6, further comprising:
- a first bitline connected to the source-drain path of the first select transistor in the first portion of the memory cells; and
- a second bitline connected to the source-drain path of the first select transistor in the second portion of the memory cells.

8. The memory cell of claim 7, further comprising:
- a first voltage reference configured for providing a voltage to the gate of the first select transistor in a third portion of the memory cells, the third portion including some memory cells from the first portion and the second portion of memory cells, so that when a bitline programming voltage is applied to the source-drain path of the first select transistor in the third portion of memory cells to enable programming of the floating gate storage transistor in the third portion of memory cells, and when programming of the floating gate storage transistor in the third portion of memory cells is not desired, damage will not occur to an oxide material between the gate and drain of the first select transistor in the third portion of memory cells; and
- a second voltage reference configured for providing a voltage to the gate of the second select transistor in the third portion of the memory cells so that when the bitline programming voltage is applied to the source-drain path of the first select transistor in at least some of the third portion of memory cells, and programming of the floating gate storage transistor in the third portion of memory cells is not desired, charge stored by the floating gate storage transistor in the third portion of memory cells will not be disturbed.

9. The memory cell of claim 8, wherein the first select transistor, the second select transistor and the floating gate storage transistor of the memory cells comprise NMOS devices.

10. The memory cell of claim 9, wherein the first select transistor and the second select transistor of the memory cells comprise volatile devices.

11. A memory cell comprising:
- a first select transistor having a source-drain path and a gate;
- a second select transistor having a source-drain path in series with the source-drain path of the first select transistor, and having a gate;
- a floating gate transistor having a source-drain path connected in series with the source-drain path of the second select transistor;
- an output line connected to the source-drain path of the floating gate transistor; and
- a bitline connected to the source-drain path of the first select transistor.

12. The array of memory cells of claim 11, wherein the memory cells share a common output line connected to the source drain path of the floating gate transistor of each cell and share a common bitline connected to the source-drain path of the first select transistor of each cell.

* * * * *